(12) United States Patent
Sawada et al.

(10) Patent No.: US 11,081,267 B2
(45) Date of Patent: Aug. 3, 2021

(54) FLAT POWDER FOR HIGH FREQUENCY APPLICATIONS AND MAGNETIC SHEET

(71) Applicant: Sanyo Special Steel Co., Ltd., Himeji (JP)

(72) Inventors: Toshiyuki Sawada, Himeji (JP); Kodai Miura, Himeji (JP)

(73) Assignee: Sanyo Special Steel Co., Ltd., Hyogo (JP)

( * ) Notice: Subject to any disclaimer, the term of this patent is extended or adjusted under 35 U.S.C. 154(b) by 164 days.

(21) Appl. No.: 16/330,151

(22) PCT Filed: Oct. 23, 2017

(86) PCT No.: PCT/JP2017/038218
§ 371 (c)(1),
(2) Date: Mar. 4, 2019

(87) PCT Pub. No.: WO2018/079498
PCT Pub. Date: May 3, 2018

(65) Prior Publication Data
US 2019/0206596 A1    Jul. 4, 2019

(30) Foreign Application Priority Data

Oct. 27, 2016   (JP) ............................. JP2016-210568

(51) Int. Cl.
| | |
|---|---|
| *H01F 1/16* | (2006.01) |
| *B22F 1/00* | (2006.01) |
| *C22C 38/22* | (2006.01) |
| *C22C 38/24* | (2006.01) |
| *C22C 38/02* | (2006.01) |
| *C22C 38/04* | (2006.01) |
| *C22C 38/00* | (2006.01) |
| *H05K 9/00* | (2006.01) |
| *H01F 1/26* | (2006.01) |
| *C22C 33/02* | (2006.01) |
| *H01F 1/20* | (2006.01) |

(52) U.S. Cl.
CPC ............. *H01F 1/16* (2013.01); *B22F 1/0055* (2013.01); *C22C 33/0285* (2013.01); *C22C 38/00* (2013.01); *C22C 38/001* (2013.01); *C22C 38/02* (2013.01); *C22C 38/04* (2013.01); *C22C 38/22* (2013.01); *C22C 38/24* (2013.01); *H01F 1/20* (2013.01); *H01F 1/26* (2013.01); *H05K 9/0083* (2013.01); *B22F 2301/35* (2013.01); *B22F 2304/10* (2013.01); *C22C 2202/02* (2013.01)

(58) Field of Classification Search
CPC .................................. H01F 1/16; B22F 1/0055
USPC ........................................................ 148/307
See application file for complete search history.

(56) References Cited

U.S. PATENT DOCUMENTS

| | | | |
|---|---|---|---|
| 5,755,986 A * | 5/1998 | Yamamoto | C22C 1/0441 148/100 |
| 7,799,147 B2 | 9/2010 | Matsukawa et al. | |
| 8,350,559 B2 | 1/2013 | Fukushima | |
| 2009/0242082 A1* | 10/2009 | Imai | C22C 45/02 148/403 |

FOREIGN PATENT DOCUMENTS

| | | | |
|---|---|---|---|
| CN | 101194039 A | | 6/2008 |
| JP | 8250316 A | | 9/1996 |
| JP | 2007266031 A | | 10/2007 |
| JP | 2010272608 A | * | 12/2010 |
| JP | 2010272608 A | | 12/2010 |
| JP | 201122661 A | | 2/2011 |
| JP | 20129797 A | | 1/2012 |
| JP | 201639222 A | | 3/2016 |

OTHER PUBLICATIONS

Translation JP-2010272608-A (Year: 2012).*

* cited by examiner

*Primary Examiner* — Coris Fung
*Assistant Examiner* — Danielle Carda
(74) *Attorney, Agent, or Firm* — The Webb Law Firm

(57) ABSTRACT

A flaky powder for high frequency application is provided, wherein the flaky powder contains 1.5 to 3.0 mass % C, 10 to 20 mass % Cr, 0.03 to 0.30 mass % N, and the balance being Fe and incidental impurities, and has an average particle diameter of 200 μm or less, an average thickness of 5 μm or less, an average aspect ratio of 5 or more, a saturation magnetization of more than 1.0 T, and a frequency (FR) of 200 MHz or more at which tan δ reaches 0.1. Based on the flaky powder, a novel magnetic flaky metal powder having a saturation magnetization exceeding 1.0 T and exhibiting a high FR of 200 MHz or more, and magnetic sheets including the magnetic flaky metal powder are provided.

4 Claims, No Drawings

FLAT POWDER FOR HIGH FREQUENCY APPLICATIONS AND MAGNETIC SHEET

This application is the United States national phase of International Application No. PCT/JP2017/038218 filed Oct. 23, 2017, and claims priority to Japanese Patent Application No. 2016-210568 filed Oct. 27, 2016, the disclosure of each of which is hereby incorporated by reference in its entirety.

TECHNICAL FIELD

The present invention relates to a flaky powder and magnetic sheets having excellent magnetic properties even at high frequencies for use in various electronic devices.

BACKGROUND ART

Various kinds of electronic devices, such as smartphones, cellular phones, laptop personal computers, and tablet personal computers, have prevailed widespread, and electromagnetic interference caused by the miniaturization of the devices has raised a problem. Further, the shift to higher frequencies due to higher communication rates increasingly require magnetic sheets that exhibit excellent magnetic properties at higher frequencies. With the magnetic sheets used in such electronic devices, JP2012-009797A (PTL 1) discloses a soft magnetic resin composition and an electromagnetic wave absorber capable of appropriately adjusting the electromagnetic wave absorptive frequency in a high frequency band of 1 GHz or more and giving superior electromagnetic absorptive properties even at small thickness.

JP2007-266031A (PTL 2) discloses a magnetic core for an antenna suitable for a non-contact IC tag by radio frequency identification (RFID) technology. JP2011-22661A (PTL 3) discloses a technique of a digitizer sheet for improving the position detecting characteristics of an electromagnetic induction digitizer. JP2016-39222A (PTL 4) discloses an inductor with a magnetic core and a coil and a method for manufacturing the same. Soft magnetic flaky powder of Fe—Si—Al alloy or Fe—Si—Cr alloy is kneaded with rubber or resin and rolled into sheets, and the resultant sheets have been widely used.

CITATION LIST

Patent Literatures

PTL 1: JP2012-009797A
PTL 2: JP2007-266031A
PTL 3: JP2011-22661A
PTL 4: JP2016-39222A

SUMMARY OF INVENTION

Magnetic properties required in such magnetic sheets are real permeability μ' and imaginary permeability μ" with high saturation magnetization. The imaginary permeability μ" is barely detected at low frequency, but increases sharply after the frequency exceeds a specific value. In the case that the imaginary permeability μ" increases sharply above a critical frequency, the magnetic sheet can be used in a frequency below the critical frequency. In use at high frequencies, tan δ, i.e., the ratio μ"/μ' should be kept at a small value over a higher frequency. The frequency at which tan δ reaches 0.1 will now be referred to as "FR".

In the above-mentioned patent literatures, the flaky powder of the Fe—Si—Al alloy has a saturation magnetization of 1.0 T and is usable until an FR (frequency) of about 20 MHz or less. In general, the flaky powder of Fe—Si—Cr alloy has a higher saturation magnetization of about 1.2 T, and is usable until an FR of about 50 MHz or less at most. As described above, no conventional flaky powder can be used at a high frequency band, for example, an FR (frequency) exceeding 200 MHz while exhibiting a saturated magnetization of more than 1.0 T.

Accordingly, an object of the present invention is to provide a novel magnetic flaky metal powder having a saturation magnetization exceeding 1.0 T and exhibiting a high FR of 200 MHz or more, and magnetic sheets including the magnetic flaky metal powder.

In one embodiment of the present invention, a flaky powder for high frequency application is provided, the flaky powder comprising 1.5 to 3.0 mass % C, 10 to 20 mass % Cr, 0.03 to 0.30 mass % N and the balance being Fe and incidental impurities, and having an average particle diameter of 200 μm or less, an average thickness of 5 μm or less, an average aspect ratio of 5 or more, a saturation magnetization exceeding 1.0 T, and a frequency (FR) of 200 MHz or more at which tan δ reaches 0.1.

In another embodiment of the present invention, a magnetic sheet including the flaky powder is provided.

DESCRIPTION OF EMBODIMENTS

Flaky Powder

The background for limiting the composition of the components will be described below. In this description, the contents of components in the composition are represented in % by mass.

In the flaky powder of the present invention, the C content is 1.5 to 3.0%. C is an essential element to raise the FR. It was found that a martensitic phase having a high content of C with a high dislocation density was induced when a Fe-based alloy having a high content of C was pulverized and flattened, and the FR of a powder containing a large amount of this phase was extremely high. The FR is low at a C content of less than 1.5%, and the saturation magnetization decreases at a C content exceeding 3.0%. The C content is preferably from more than 1.8% to less than 2.7%, and more preferably from more than 2.0% to less than 2.4%.

In the flaky powder of the present invention, the Cr content is 10 to 20%. Cr is an essential element to lower the initiation temperature of the martensitic transformation (hereinafter referred to as Ms point) and generate a retained austenitic phase in the raw material powder. Since the martensitic phase of the Fe alloy containing high concentration of C in the present invention has remarkably high hardness, the raw material powder has poor ductility during a flattening process, and is not processed into a flaky shape, but merely pulverized. Cr is accordingly essential for obtaining flaky powder with a higher aspect ratio through production of a relatively soft retained austenitic phase in the raw material powder. Cr is also an important element which greatly contributes to an improvement in corrosion resistance and an increased amount of N in the solid solution. However, a high aspect ratio cannot be achieved by the flattening process at a Cr content of less than 10%, whereas the saturation magnetization decreases at a Cr content of more than 20%. The Cr content is preferably from more than 12% to less than 19%, and more preferably from more than 16% to less than 18%.

In the flaky powder of the present invention, the N content is 0.03 to 0.30%. Similar to Cr, N is an essential element that generates a retained austenitic phase in the raw material powder without a significant reduction in the saturation magnetization compared to Cr. Furthermore, N can achieve a significantly high FR like C. However, these effects cannot be achieved at a N content of less than 0.03%, and the saturation magnetization decreases at a N content of more than 0.30%. The N content is preferably from more than 0.04% to less than 0.20%, and more preferably from more than 0.05% to less than 0.15%.

The flaky powder of the present invention has an average particle diameter of 200 μm or less, an average thickness of 5 μm or less, and an average aspect ratio of 5 or more. It is generally known that the real permeability μ' of the magnetic sheet increases as the aspect ratio (the longitudinal length to the thickness) of the flaky powder used in the sheet increases. Although a larger average particle diameter and a smaller thickness are preferred, the surface irregularities of the magnetic sheet increase as the average particle diameter increases. From this viewpoint, the average particle diameter is preferably less than 70 μm, and more preferably less than 25 μm because the surface of the magnetic sheet has large irregularities at an average particle diameter of more than 200 μm. An average thickness of the flaky powder exceeding 5 μm causes a decrease in the aspect ratio and thus a decrease in the real permeability μ'. The average thickness is preferably less than 3 μm, and more preferably less than 1 μm. The real permeability μ' decreases at an average aspect ratio of less than 5. The average aspect ratio is preferably more than 10, and more preferably more than 20.

The flaky powder of the present invention has a saturation magnetization of more than 1.0 T. A high saturation magnetization exceeding 1.0 T is required from the viewpoint of thinning of the magnetic sheet and DC superposition characteristics. The high saturation magnetization has some advantages such that the magnetic sheet can be thinned and the so-called DC superposition characteristics can be improved because a maximum allowable magnetic flux density of the magnetic sheet is higher than an applied external magnetic field. The saturation magnetization is preferably more than 1.10 T, and more preferably more than 1.25 T. As another magnetic characteristic, the coercive force measured by applying a magnetic field in the longitudinal direction of the flaky powder can increase the FR. A coercive force exceeding 2400 A/m is preferred. It is believed that the coercive force is complicatedly influenced by the magnetocrystalline anisotropy constant or the dislocation density. Since the flaky powder can have a coercive force exceeding 2400 A/m, a term "magnetic" is simply used instead of a conventional term "soft magnetic", and the term "magnetic" herein thereby includes "soft magnetic".

The flaky powder of the present invention preferably contains 1.0% or less Si and 1.0% or less Mn. Si and Mn can be appropriately added as needed for adjusting the Ms point and the hardness of the raw material powder, and can increase the aspect ratio given through the flattening process. The saturation magnetization decreases at a Si or Mn content of more than 1.0%. Each content of Si and Mn is more preferably from more than 0.10% to less than 0.70%, and further more preferably from more than 0.20% to less than 0.50%.

The flaky powder of the present invention preferably contains 1.0% or less Mo and 7.5% or less V. Mo and V can be appropriately added as needed for adjusting the hardness of the raw material powder as well as raising the FR. The saturation magnetization decreases at a Mo content of more than 1.0%. The Mo content is more preferably from more than 0.1% to less than 0.7%, and further more preferably from more than 0.3% to less than 0.5%. Meanwhile, the saturation magnetization decreases at a V content of more than 7.5%. The V content is more preferably from more than 0.1% to less than 7.0%, and further more preferably from more than 4.0% to less than 6.0%

Production of Flaky Powder

Various atomization processes, such as water atomization, gas atomization, and disk atomization, are preferred for manufacturing the raw material powder. Many martensitic phases are produced in the raw material powder prepared by a rapid cooling process, such as the atomization process.

In addition, a first heat treatment on the raw material powder before the flattening process can increase the aspect ratio through adjustment of the hardness of the raw material powder. The temperature of the first heat treatment is preferably 1200° C. or lower, more preferably from higher than 300° C. to lower than 1100° C., and further more preferably from higher than 750° C. to lower than 1000° C., because the powder is sintered at the temperature exceeding 1200° C.

A second heat treatment on the flaky powder after the flattening process can effectively increase the saturation magnetization due to a reduction in the retained austenitic phase and raise the FR with transformation corresponding to a so-called secondary age hardening. The temperature of the second heat treatment is preferably 900° C. or lower, more preferably from higher than 300° C. to lower than 850° C., and most preferably from higher than 500° C. to lower than 800° C., because the martensitic phase transforms into a ferritic phase and the FR decreases at a temperature exceeding 900° C.

Magnetic Sheets

The magnetic sheets of the present invention contain the flaky powder as described above. The magnetic sheet has a general structure that has been proposed, and can be produced by a general known method. In addition to the magnetic sheet, various magnetic resin forms, such as a magnetic film, a magnetic compound, a magnetic coating, can also be produced by a general known method and used in various fields. In the magnetic sheet including the flaky powder of the present invention, a frequency at which imaginary permeability μ" sharply increases is 100 MHz or more (FR is 200 MHz or more), and thus the usable frequency is thereby 100 MHz (or higher).

EXAMPLES

The present invention will now be described in detail by way of examples. Effects of the present invention will be clarified by the examples, which should not be construed to limit the present invention.

Samples 1 to 122

(1) Preparation of Flaky Powder

Each powder containing predetermined components was prepared by either water atomization, gas atomization, disk atomization, or pulverization after alloying through melting (cast pulverization) and was classified into 150 μm or less. Each atomization process is known in the art. In this process, an alumina crucible was used to melt the alloy, and the molten alloy was discharged through a nozzle having a diameter of 2 mm disposed below the crucible, and the atomization was performed by spraying high-pressure water, spraying high pressure gas (argon or nitrogen), or applying a centrifugal force with a rotary disk, to divide the molten alloy.

The N content can be adjusted by selecting a raw material containing a high concentration of N and/or selecting high pressure nitrogen gas for atomization. A part of these powders was subjected to a heat treatment prior to the subsequent flattening process. The flattening process was applied to these raw material powders. The flattening process was based on a general known process, and was performed by an attritor process in which balls with a diameter of 4.8 mm made of SUJ2 were put into a stirring vessel together with raw material powder and industrial ethanol, and stirred by rotation of the blades with a rotation rate of 300 rpm.

The amount of industrial ethanol added was 100 parts by mass with respect to 100 parts by mass of the raw material powder. Since a tap density decreased with the flattening time, a small amount of powder was sampled for measuring the tap density during the flattening process, and the flattening process was determined to be completed when the tap density reached a predetermined value. After the flattening process, the flaky powder and industrial ethanol were transferred from the stirring vessel to a stainless-steel plate and dried at 80° C. for 24 hours. Part of the resultant flaky powder was heat-treated in vacuum, in argon or in nitrogen, and used for various evaluations.

(2) Evaluation of Flaky Powder

The average particle diameter, the tap density, the saturation magnetization and the permeability of the resultant flaky powder were evaluated. The average particle diameter was measured by a laser diffraction method. In measurement of the tap density, flaky powder (about 20 g) was packed in a cylinder having a volume of 100 cm$^3$, and the packing density was measured after 200 tapping operations of the cylinder at a drop height of 10 mm. The saturation magnetization was evaluated with a vibrating sample magnetometer (VSM).

(3) Preparation and Evaluation of Magnetic Sheet

A magnetic sheet including the resultant flaky powder was prepared by the following procedures. First, chlorinated polyethylene was dissolved in toluene and then the flaky powder was dispersed into the solution. This dispersion was applied onto polyester resin to a thickness of about 100 μm, dried at room temperature and normal humidity, and then pressed at 130° C. under a pressure of 15 MPa to prepare a magnetic sheet. Dimensions of the magnetic sheet was 150 mm by 150 mm with a thickness of 50 μm. The volume filling ratio of the flaky powder in each magnetic sheet was about 50%.

Second, the magnetic sheet was cut into a donut shape having an outer diameter of 7 mm and an inner diameter of 3 mm. The impedance characteristics or frequency characteristics were measured at room temperature with an impedance meter, and the real and imaginary permeabilities μ' and μ" were calculated from the resultant characteristics. The real permeability μ' was evaluated as an average value over 1 to 5 MHz, and the FR was used for the evaluation of high-frequency characteristics. In addition, a sample embedded in a resin was prepared and polished to observe the magnetic sheet in the thickness direction, and SEM observation was conducted on fifty powders randomly selected, and the average thickness and the average aspect ratio were calculated from analysis of SEM images. The aspect ratio is defined by "the longitudinal length to the thickness of the flaky powder".

Tables 1 to 3 show the compositions of the raw material powders and the results of evaluation of the flaky powder and the magnetic sheet prepared in the above process. Samples 1 to 100 are inventive examples, and Samples 101 to 122 are comparative examples. In Tables 1 to 3, the FR is simply indicated by "frequency".

TABLE 1

| | Powder composition (mass %) | | | | | | | | Average diameter D50 (μm) | Tap density (TD) |
|---|---|---|---|---|---|---|---|---|---|---|
| No. | C | Cr | N | Si | Mn | Mo | V | Fe | | |
| 1 | 3.0 | 17.0 | 0.10 | — | — | — | — | Bal. | 24 | 1.0 |
| 2 | 2.3 | 13.0 | 0.30 | — | — | — | — | Bal. | 30 | 1.1 |
| 3 | 2.3 | 10.0 | 0.07 | — | — | — | — | Bal. | 36 | 0.8 |
| 4 | 2.1 | 20.0 | 0.14 | — | — | — | — | Bal. | 47 | 2.2 |
| 5 | 1.9 | 18.5 | 0.09 | — | — | — | — | Bal. | 50 | 1.6 |
| 6 | 1.5 | 16.5 | 0.08 | — | — | — | — | Bal. | 22 | 1.2 |
| 7 | 2.3 | 20.0 | 0.12 | — | — | — | — | Bal. | 21 | 1.1 |
| 8 | 2.6 | 18.0 | 0.30 | — | — | — | — | Bal. | 29 | 2.7 |
| 9 | 3.0 | 17.0 | 0.14 | — | — | — | — | Bal. | 20 | 2.2 |
| 10 | 1.9 | 13.0 | 0.17 | — | — | — | — | Bal. | 51 | 1.5 |
| 11 | 2.2 | 10.0 | 0.12 | — | — | — | — | Bal. | 18 | 0.5 |
| 12 | 2.1 | 17.5 | 0.30 | — | — | — | — | Bal. | 23 | 0.9 |
| 13 | 2.0 | 19.5 | 0.19 | — | — | — | — | Bal. | 47 | 0.6 |
| 14 | 1.5 | 17.0 | 0.10 | — | — | — | — | Bal. | 60 | 2.5 |
| 15 | 2.6 | 11.0 | 0.05 | — | — | — | — | Bal. | 28 | 1.7 |
| 16 | 2.3 | 17.0 | 0.03 | — | — | — | — | Bal. | 21 | 1.1 |
| 17 | 3.0 | 17.0 | 0.11 | 0.40 | 0.35 | 0.4 | 5.0 | Bal. | 22 | 0.9 |
| 18 | 2.9 | 10.5 | 0.30 | 0.90 | 0.45 | 0.8 | 2.0 | Bal. | 31 | 2.5 |
| 19 | 2.8 | 13.0 | 0.22 | 0.60 | 1.00 | 0.4 | 5.0 | Bal. | 30 | 1.7 |
| 20 | 2.7 | 19.5 | 0.23 | 0.95 | 0.10 | 0.5 | 0.5 | Bal. | 25 | 1.8 |
| 21 | 2.6 | 15.5 | 0.05 | 0.45 | 0.15 | 1.0 | 2.5 | Bal. | 18 | 2.7 |
| 22 | 2.6 | 17.5 | 0.20 | 0.85 | 0.50 | 0.1 | 0.5 | Bal. | 26 | 1.8 |
| 23 | 2.5 | 14.0 | 0.28 | 0.15 | 0.55 | 0.5 | 7.5 | Bal. | 39 | 1.9 |
| 24 | 2.5 | 13.5 | 0.09 | 0.75 | 0.60 | 0.9 | 0.1 | Bal. | 31 | 2.2 |
| 25 | 2.4 | 18.0 | 0.16 | 0.50 | 0.90 | 0.7 | 7.5 | Bal. | 45 | 1.8 |
| 26 | 2.3 | 17.5 | 0.04 | 0.90 | 0.45 | 0.1 | 0.1 | Bal. | 36 | 3.0 |
| 27 | 2.2 | 17.0 | 0.10 | 0.30 | 0.30 | 0.4 | 5.5 | Bal. | 17 | 1.2 |
| 28 | 2.1 | 10.0 | 0.15 | 0.80 | 0.45 | 0.3 | 1.0 | Bal. | 48 | 1.6 |
| 29 | 2.0 | 20.0 | 0.21 | 0.65 | 0.80 | 0.9 | 1.0 | Bal. | 45 | 2.2 |
| 30 | 1.9 | 15.0 | 0.24 | 0.10 | 0.40 | 0.6 | 2.5 | Bal. | 55 | 0.9 |
| 31 | 1.5 | 16.5 | 0.09 | 0.30 | 0.35 | 0.4 | 5.5 | Bal. | 20 | 1.0 |

TABLE 1-continued

| No. | | | | | | | | | | |
|---|---|---|---|---|---|---|---|---|---|---|
| 32 | 2.2 | 20.0 | 0.09 | 0.40 | 0.35 | 0.4 | 4.5 | Bal. | 22 | 1.2 |
| 33 | 1.7 | 18.0 | 0.30 | 0.40 | 0.20 | 0.2 | 7.0 | Bal. | 52 | 0.7 |
| 34 | 3.0 | 17.0 | 0.16 | 0.15 | 0.55 | 0.4 | 1.5 | Bal. | 58 | 1.0 |
| 35 | 2.3 | 13.0 | 0.09 | 1.00 | 0.95 | 0.2 | 3.0 | Bal. | 33 | 1.2 |
| 36 | 2.1 | 10.0 | 0.08 | 0.40 | 0.40 | 0.4 | 5.5 | Bal. | 15 | 0.5 |
| 37 | 2.3 | 16.5 | 0.30 | 0.30 | 0.40 | 0.5 | 5.0 | Bal. | 24 | 1.1 |
| 38 | 1.6 | 15.0 | 0.19 | 0.20 | 1.00 | 0.8 | 1.5 | Bal. | 56 | 1.4 |
| 39 | 1.5 | 18.5 | 0.10 | 0.70 | 0.90 | 0.5 | 3.5 | Bal. | 56 | 1.6 |
| 40 | 2.0 | 19.0 | 0.05 | 0.55 | 0.25 | 1.0 | 2.5 | Bal. | 42 | 1.9 |

| No. | Average thickness (µm) | Average aspect ratio (AR) | Saturation magneti-zation (T) | Raw material powder production | Heat treatment (° C.) 1st | Heat treatment (° C.) 2nd | Real perme-ability (µ') | Frequency (MHz) | Note |
|---|---|---|---|---|---|---|---|---|---|
| 1 | 1.0 | 28 | 1.26 | GA(N2) | — | — | 4.6 | 671 | Present |
| 2 | 1.0 | 27 | 1.37 | GA(N2) | — | — | 8.6 | 580 | Invention |
| 3 | 0.9 | 45 | 1.61 | GA(N2) | — | — | 13.5 | 335 | Examples |
| 4 | 1.9 | 23 | 1.42 | GA(N2) | — | — | 11.8 | 460 | |
| 5 | 1.5 | 28 | 1.56 | GA(N2) | — | — | 12.8 | 277 | |
| 6 | 1.0 | 25 | 1.39 | GA(N2) | — | — | 18.2 | 201 | |
| 7 | 1.0 | 18 | 1.28 | WA | — | — | 9.8 | 469 | |
| 8 | 3.1 | 9 | 1.44 | WA | — | — | 6.4 | 706 | |
| 9 | 2.8 | 9 | 1.27 | WA | — | — | 4.6 | 751 | |
| 10 | 1.6 | 33 | 1.53 | WA | — | — | 15.1 | 221 | |
| 11 | 0.5 | 31 | 1.37 | WA | — | — | 15.7 | 238 | |
| 12 | 1.0 | 24 | 1.54 | CP | — | — | 10.5 | 393 | |
| 13 | 0.7 | 58 | 1.29 | CP | — | — | 12.0 | 361 | |
| 14 | 4.1 | 15 | 1.48 | CP | — | — | 18.4 | 210 | |
| 15 | 2.0 | 13 | 1.51 | CP | — | — | 10.2 | 367 | |
| 16 | 1.0 | 24 | 1.50 | CP | — | — | 12.7 | 328 | |
| 17 | 1.0 | 21 | 1.25 | GA(N2) | — | — | 6.0 | 778 | |
| 18 | 3.2 | 11 | 1.18 | GA(N2) | — | — | 12.7 | 447 | |
| 19 | 1.5 | 18 | 1.05 | GA(N2) | — | — | 8.7 | 491 | |
| 20 | 1.7 | 14 | 1.22 | GA(N2) | — | — | 12.8 | 320 | |
| 21 | 2.9 | 7 | 1.22 | GA(N2) | — | — | 10.3 | 395 | |
| 22 | 2.2 | 12 | 1.19 | GA(N2) | — | — | 14.3 | 375 | |
| 23 | 1.8 | 23 | 1.27 | GA(N2) | — | — | 6.6 | 681 | |
| 24 | 3.0 | 11 | 1.25 | GA(N2) | — | — | 14.4 | 282 | |
| 25 | 1.5 | 36 | 1.17 | GA(N2) | — | — | 8.5 | 512 | |
| 26 | 3.8 | 11 | 1.27 | GA(N2) | — | — | 19.3 | 208 | |
| 27 | 1.3 | 13 | 1.33 | GA(N2) | — | — | 11.9 | 459 | |
| 28 | 1.9 | 21 | 1.46 | GA(N2) | — | — | 20.4 | 200 | |
| 29 | 2.1 | 19 | 1.30 | GA(N2) | — | — | 13.7 | 220 | |
| 30 | 0.8 | 72 | 1.49 | GA(N2) | — | — | 13.4 | 344 | |
| 31 | 1.0 | 17 | 1.55 | GA(N2) | — | — | 17.7 | 222 | |
| 32 | 1.0 | 25 | 1.24 | GA(N2) | — | — | 11.6 | 364 | |
| 33 | 0.8 | 59 | 1.42 | GA(N2) | — | — | 13.9 | 303 | |
| 34 | 1.1 | 63 | 1.30 | GA(N2) | — | — | 4.4 | 724 | |
| 35 | 1.3 | 25 | 1.25 | GA(N2) | — | — | 20.0 | 203 | |
| 36 | 0.5 | 32 | 1.28 | GA(N2) | — | — | 15.5 | 239 | |
| 37 | 1.0 | 25 | 1.14 | DA | — | — | 9.1 | 536 | |
| 38 | 1.6 | 33 | 1.27 | DA | — | — | 17.9 | 209 | |
| 39 | 1.8 | 36 | 1.41 | DA | — | — | 18.4 | 207 | |
| 40 | 2.1 | 24 | 1.30 | DA | — | — | 16.6 | 247 | |

Remark 1) WA: Water atomization, GA(Ar): Ar atomization, GA(N2): Nitrogen atomization, DA: Disk atomization, CP: Cast pulverization, VC: Vacuum, NP: Non-producible
Remark 2) Temp. (Atmosphere) in heat treatment
Remark 3) Underline indicates "outside of the present invention conditions and insufficient effects".

TABLE 2

| No. | Powder composition (mass %) | | | | | | | | Average diameter D50 (µm) | Tap density (TD) |
|---|---|---|---|---|---|---|---|---|---|---|
| | C | Cr | N | Si | Mn | Mo | V | Fe | | |
| 41 | 2.3 | 17.0 | 0.03 | 0.35 | 0.30 | 0.4 | 5.0 | Bal. | 24 | 1.0 |
| 42 | 2.3 | 17.5 | 0.10 | 1.00 | 0.35 | 0.4 | 5.0 | Bal. | 23 | 1.0 |
| 43 | 1.8 | 14.0 | 0.03 | 0.60 | 0.60 | 0.4 | 6.5 | Bal. | 49 | 1.6 |
| 44 | 3.0 | 14.5 | 0.20 | 0.40 | 0.35 | 0.3 | 4.5 | Bal. | 16 | 1.1 |
| 45 | 2.9 | 18.0 | 0.10 | 0.20 | 0.10 | 0.6 | 6.0 | Bal. | 17 | 2.3 |
| 46 | 2.1 | 17.5 | 0.12 | 0.10 | 0.30 | 0.4 | 5.0 | Bal. | 24 | 1.0 |
| 47 | 2.2 | 17.0 | 0.11 | 0.35 | 1.00 | 0.4 | 4.5 | Bal. | 20 | 1.2 |
| 48 | 2.5 | 10.0 | 0.11 | 0.20 | 0.60 | 0.7 | 7.0 | Bal. | 35 | 1.3 |
| 49 | 1.5 | 18.0 | 0.18 | 0.30 | 0.40 | 0.3 | 2.0 | Bal. | 59 | 3.0 |

TABLE 2-continued

| 50 | 2.7 | 17.5 | 0.03 | 0.80 | 0.20 | 0.7 | 4.0 | Bal. | 26 | 2.8 |
| 51 | 2.2 | 16.5 | 0.10 | 0.40 | 0.10 | 0.4 | 5.5 | Bal. | 18 | 0.5 |
| 52 | 2.3 | 17.0 | 0.10 | 0.30 | 0.40 | 1.0 | 5.5 | Bal. | 20 | 1.0 |
| 53 | 2.3 | 20.0 | 0.29 | 0.90 | 0.30 | 0.6 | 7.0 | Bal. | 29 | 1.4 |
| 54 | 1.9 | 12.5 | 0.25 | 0.25 | 0.85 | 0.4 | 4.5 | Bal. | 31 | 2.9 |
| 55 | 1.6 | 15.5 | 0.07 | 1.00 | 0.20 | 0.3 | 5.0 | Bal. | 49 | 2.5 |
| 56 | 2.1 | 17.5 | 0.08 | 0.40 | 0.40 | 0.1 | 5.0 | Bal. | 19 | 0.5 |
| 57 | 2.3 | 16.0 | 0.09 | 0.35 | 0.35 | 0.4 | 7.5 | Bal. | 24 | 1.0 |
| 58 | 1.8 | 16.0 | 0.19 | 0.10 | 0.25 | 0.8 | 6.5 | Bal. | 44 | 2.7 |
| 59 | 1.9 | 13.0 | 0.06 | 0.25 | 0.80 | 0.6 | 5.5 | Bal. | 46 | 0.6 |
| 60 | 2.0 | 17.0 | 0.26 | 0.85 | 0.65 | 0.1 | 2.0 | Bal. | 38 | 1.3 |
| 61 | 2.2 | 17.5 | 0.12 | 0.40 | 0.35 | 0.4 | 0.1 | Bal. | 22 | 1.0 |
| 62 | 2.2 | 16.5 | 0.11 | 0.35 | 0.35 | 0.4 | 4.0 | Bal. | 195 | 1.1 |
| 63 | 2.3 | 16.5 | 0.27 | 0.45 | 0.70 | 0.5 | 3.5 | Bal. | 180 | 2.4 |
| 64 | 1.7 | 13.5 | 0.18 | 0.50 | 0.40 | 0.9 | 5.0 | Bal. | 150 | 2.0 |
| 65 | 1.9 | 19.0 | 0.12 | 0.60 | 0.95 | 0.2 | 3.0 | Bal. | 100 | 2.0 |
| 66 | 2.3 | 12.0 | 0.26 | 0.30 | 0.80 | 0.3 | 4.5 | Bal. | 65 | 1.2 |
| 67 | 2.4 | 18.0 | 0.08 | 0.55 | 0.15 | 0.2 | 6.0 | Bal. | 20 | 1.8 |
| 68 | 2.2 | 17.0 | 0.12 | 0.30 | 0.35 | 0.4 | 5.5 | Bal. | 20 | 3.5 |
| 69 | 2.7 | 16.5 | 0.07 | 0.70 | 0.35 | 0.5 | 0.5 | Bal. | 33 | 2.4 |
| 70 | 2.1 | 17.0 | 0.14 | 0.35 | 0.75 | 0.6 | 5.5 | Bal. | 45 | 0.5 |
| 71 | 1.6 | 14.5 | 0.25 | 0.35 | 0.75 | 0.7 | 5.5 | Bal. | 50 | 2.4 |
| 72 | 1.8 | 11.5 | 0.13 | 0.75 | 0.65 | 0.8 | 6.0 | Bal. | 46 | 3.3 |
| 73 | 2.6 | 17.0 | 0.08 | 0.30 | 0.40 | 0.4 | 5.0 | Bal. | 19 | 2.6 |
| 74 | 2.6 | 18.0 | 0.13 | 0.65 | 0.30 | 0.4 | 6.5 | Bal. | 30 | 0.5 |
| 75 | 2.5 | 11.5 | 0.27 | 0.40 | 0.70 | 0.9 | 4.0 | Bal. | 36 | 1.2 |
| 76 | 2.9 | 19.5 | 0.25 | 0.90 | 0.90 | 0.9 | 7.5 | Bal. | 21 | 1.1 |
| 77 | 2.2 | 17.0 | 0.10 | 0.30 | 0.30 | 0.4 | 5.5 | Bal. | 196 | 0.7 |
| 78 | 2.2 | 17.0 | 0.10 | 0.30 | 0.30 | 0.4 | 5.5 | Bal. | 156 | 1.1 |
| 79 | 2.2 | 17.0 | 0.10 | 0.30 | 0.30 | 0.4 | 5.5 | Bal. | 145 | 1.1 |
| 80 | 2.2 | 17.0 | 0.10 | 0.30 | 0.30 | 0.4 | 5.5 | Bal. | 148 | 1.0 |

| No. | Average thickness (μm) | Average aspect ratio (AR) | Saturation magnetization (T) | Raw material powder production | Heat treatment (° C.) 1st | Heat treatment (° C.) 2nd | Real permeability (μ') | Frequency (MHz) | Note |
|---|---|---|---|---|---|---|---|---|---|
| 41 | 1.0 | 24 | 1.16 | DA | — | — | 11.7 | 374 | Present |
| 42 | 1.0 | 23 | 1.23 | WA | — | — | 16.5 | 231 | Invention |
| 43 | 2.0 | 21 | 1.22 | WA | — | — | 19.4 | 235 | Examples |
| 44 | 1.3 | 11 | 1.16 | WA | — | — | 5.6 | 735 | |
| 45 | 3.5 | 5 | 1.28 | WA | — | — | 4.2 | 794 | |
| 46 | 1.0 | 22 | 1.33 | WA | — | — | 10.9 | 490 | |
| 47 | 1.0 | 17 | 1.16 | GA(N2) | — | — | 11.6 | 422 | |
| 48 | 1.3 | 28 | 1.31 | GA(N2) | — | — | 9.3 | 499 | |
| 49 | 4.2 | 12 | 1.56 | GA(N2) | — | — | 16.3 | 209 | |
| 50 | 3.1 | 9 | 1.06 | GA(N2) | — | — | 11.5 | 395 | |
| 51 | 0.5 | 33 | 1.26 | GA(N2) | — | — | 13.6 | 344 | |
| 52 | 1.0 | 17 | 1.19 | DA | — | — | 11.3 | 411 | |
| 53 | 1.4 | 20 | 1.12 | DA | — | — | 11.3 | 405 | |
| 54 | 4.6 | 6 | 1.48 | DA | — | — | 15.0 | 284 | |
| 55 | 2.6 | 17 | 1.49 | DA | — | — | 23.4 | 205 | |
| 56 | 0.5 | 33 | 1.16 | DA | — | — | 13.6 | 333 | |
| 57 | 1.0 | 28 | 1.16 | GA(Ar) | — | — | 9.8 | 379 | |
| 58 | 4.8 | 8 | 1.37 | GA(Ar) | — | — | 11.7 | 375 | |
| 59 | 0.7 | 57 | 1.33 | GA(Ar) | — | — | 16.1 | 305 | |
| 60 | 1.5 | 29 | 1.28 | GA(Ar) | — | — | 16.5 | 205 | |
| 61 | 1.0 | 24 | 1.21 | GA(Ar) | — | — | 13.1 | 219 | |
| 62 | 1.0 | 203 | 1.18 | GA(Ar) | — | — | 13.7 | 357 | |
| 63 | 5.0 | 34 | 1.29 | GA(Ar) | — | — | 11.8 | 387 | |
| 64 | 3.1 | 40 | 1.37 | GA(Ar) | — | — | 18.7 | 222 | |
| 65 | 3.2 | 37 | 1.28 | GA(Ar) | — | — | 16.1 | 296 | |
| 66 | 1.3 | 56 | 1.42 | GA(Ar) | — | — | 11.9 | 419 | |
| 67 | 2.6 | 6 | 1.31 | GA(Ar) | — | — | 10.4 | 463 | |
| 68 | 5.0 | 5 | 1.36 | GA(N2) | — | — | 12.5 | 406 | |
| 69 | 2.5 | 12 | 1.35 | GA(N2) | — | — | 11.9 | 452 | |
| 70 | 0.5 | 75 | 1.19 | GA(N2) | — | — | 13.5 | 408 | |
| 71 | 2.6 | 20 | 1.24 | GA(N2) | — | — | 16.2 | 251 | |
| 72 | 4.6 | 10 | 1.41 | GA(N2) | — | — | 20.1 | 214 | |
| 73 | 4.0 | 5 | 1.21 | WA | — | — | 8.2 | 619 | |
| 74 | 0.6 | 60 | 1.11 | WA | — | — | 8.9 | 461 | |
| 75 | 1.1 | 28 | 1.23 | WA | — | — | 11.4 | 546 | |
| 76 | 1.0 | 18 | 1.08 | WA | — | — | 6.8 | 632 | |
| 77 | 0.8 | 284 | 1.35 | GA(N2) | 1200(Ar) | — | 12.8 | 512 | |
| 78 | 0.9 | 179 | 1.41 | GA(N2) | 1050(Ar) | — | 11.7 | 386 | |

TABLE 2-continued

| | | | | | | | | |
|---|---|---|---|---|---|---|---|---|
| 79 | 0.9 | 132 | 1.36 | GA(N2) | 950(VC) | — | 11.3 | 411 |
| 80 | 1.0 | 169 | 1.23 | GA(N2) | 800(VC) | — | 11.9 | 389 |

Remark 1) WA: Water atomization, GA(Ar): Ar atomization, GA(N2): Nitrogen atomization, DA: Disk atomization, CP: Cast pulverization, VC: Vacuum, NP: Non-producible
Remark 2) Temp. (Atmosphere) in heat treatment
Remark 3) Underline indicates "outside of the present invention conditions and insufficient effects".

TABLE 3

| | Powder composition (mass %) | | | | | | | | Average diameter D50 | Tap density |
|---|---|---|---|---|---|---|---|---|---|---|
| No. | C | Cr | N | Si | Mn | Mo | V | Fe | (μm) | (TD) |
| 81 | 2.2 | 17.0 | 0.10 | 0.30 | 0.30 | 0.4 | 5.5 | Bal. | 131 | 1.0 |
| 82 | 2.2 | 17.0 | 0.10 | 0.30 | 0.30 | 0.4 | 5.5 | Bal. | 93 | 0.7 |
| 83 | 2.2 | 17.0 | 0.10 | 0.30 | 0.30 | 0.4 | 5.5 | Bal. | 45 | 1.0 |
| 84 | 2.1 | 20.0 | 0.14 | — | — | — | — | Bal. | 47 | 1.7 |
| 85 | 2.1 | 20.0 | 0.14 | — | — | — | — | Bal. | 47 | 1.9 |
| 86 | 2.1 | 20.0 | 0.14 | — | — | — | — | Bal. | 47 | 1.9 |
| 87 | 2.1 | 20.0 | 0.14 | — | — | — | — | Bal. | 47 | 1.8 |
| 88 | 2.1 | 20.0 | 0.14 | — | — | — | — | Bal. | 47 | 1.8 |
| 89 | 2.1 | 20.0 | 0.14 | — | — | — | — | Bal. | 47 | 1.9 |
| 90 | 2.1 | 20.0 | 0.14 | — | — | — | — | Bal. | 47 | 1.7 |
| 91 | 2.1 | 20.0 | 0.14 | — | — | — | — | Bal. | 47 | 1.6 |
| 92 | 2.1 | 20.0 | 0.14 | — | — | — | — | Bal. | 47 | 2.1 |
| 93 | 2.1 | 20.0 | 0.14 | — | — | — | — | Bal. | 47 | 1.5 |
| 94 | 2.1 | 20.0 | 0.14 | — | — | — | — | Bal. | 47 | 1.5 |
| 95 | 2.2 | 17.0 | 0.10 | 0.30 | 0.30 | 0.14 | 5.5 | Bal. | 145 | 0.8 |
| 96 | 2.2 | 17.0 | 0.10 | 0.30 | 0.30 | 0.14 | 5.5 | Bal. | 148 | 1.1 |
| 97 | 2.2 | 17.0 | 0.10 | 0.30 | 0.30 | 0.14 | 5.5 | Bal. | 131 | 1.1 |
| 98 | 2.2 | 17.0 | 0.10 | 0.30 | 0.30 | 0.14 | 5.5 | Bal. | 145 | 0.8 |
| 99 | 2.2 | 17.0 | 0.10 | 0.30 | 0.30 | 0.14 | 5.5 | Bal. | 148 | 0.8 |
| 100 | 2.2 | 17.0 | 0.10 | 0.30 | 0.30 | 0.14 | 5.5 | Bal. | 131 | 1.1 |
| 101 | 3.5 | 20.0 | 0.30 | — | — | — | — | Bal. | 24 | 0.9 |
| 102 | 1.3 | 16.5 | 0.08 | — | — | — | — | Bal. | 22 | 0.9 |
| 103 | 2.3 | 25.0 | 0.12 | — | — | — | — | Bal. | 21 | 1.2 |
| 104 | 2.2 | 7.0 | 0.12 | — | — | — | — | Bal. | 18 | 0.5 |
| 105 | 2.1 | 17.5 | 0.50 | — | — | — | — | Bal. | 23 | 1.2 |
| 106 | 2.3 | 17.0 | 0.01 | — | — | — | — | Bal. | 21 | 1.2 |
| 107 | 3.5 | 17.0 | 0.11 | 0.40 | 0.35 | 0.4 | 5.0 | Bal. | 22 | 1.0 |
| 108 | 1.3 | 16.5 | 0.09 | 0.40 | 0.35 | 0.4 | 5.5 | Bal. | 20 | 0.9 |
| 109 | 2.2 | 25.0 | 0.09 | 0.40 | 0.35 | 0.4 | 4.5 | Bal. | 22 | 1.2 |
| 110 | 2.1 | 7.0 | 0.08 | 0.40 | 0.40 | 0.4 | 5.5 | Bal. | 15 | 0.5 |
| 111 | 2.3 | 16.5 | 0.50 | 0.30 | 0.40 | 0.4 | 5.0 | Bal. | 24 | 1.0 |
| 112 | 2.3 | 17.0 | 0.01 | 0.35 | 0.40 | 0.4 | 5.0 | Bal. | 24 | 1.2 |
| 113 | 2.3 | 17.5 | 0.10 | 1.50 | 0.35 | 0.4 | 5.0 | Bal. | 23 | 1.2 |
| 114 | 2.2 | 17.0 | 0.11 | 0.35 | 1.50 | 0.4 | 4.5 | Bal. | 20 | 1.0 |
| 115 | 2.3 | 17.0 | 0.10 | 0.30 | 0.40 | 1.5 | 5.5 | Bal. | 20 | 1.1 |
| 116 | 2.3 | 16.0 | 0.09 | 0.35 | 0.35 | 0.4 | 8.0 | Bal. | 24 | 1.0 |
| 117 | 2.2 | 16.5 | 0.11 | 0.35 | 0.35 | 0.4 | 4.0 | Bal. | 220 | 0.9 |
| 118 | 2.2 | 17.0 | 0.12 | 0.30 | 0.35 | 0.4 | 5.5 | Bal. | 20 | 3.8 |
| 119 | 2.6 | 17.0 | 0.08 | 0.30 | 0.40 | 0.4 | 5.0 | Bal. | 19 | 2.8 |
| 120 | 2.9 | 19.5 | 0.25 | 0.90 | 0.90 | 0.9 | 7.5 | Bal. | 21 | 0.9 |
| 121 | 2.2 | 17.0 | 0.10 | 0.30 | 0.30 | 0.4 | 5.5 | Bal. | NP | NP |
| 122 | 2.1 | 20.0 | 0.14 | — | — | — | — | Bal. | 47 | 2.2 |

| | Average thickness | Average aspect ratio | Saturation magnetization | Raw material powder production | Heat treatment (° C.) | | Real permeability | Frequency | |
|---|---|---|---|---|---|---|---|---|---|
| No. | (μm) | (AR) | (T) | | 1st | 2nd | (μ') | (MHz) | Note |
| 81 | 1.0 | 131 | 1.24 | GA(N2) | 750(Ar) | — | 10.8 | 441 | Present |
| 82 | 0.8 | 133 | 1.26 | GA(N2) | 500(Ar) | — | 12.8 | 437 | Invention |
| 83 | 0.9 | 44 | 1.35 | GA(N2) | 300(N2) | — | 11.5 | 447 | Examples |
| 84 | 1.9 | 28 | 1.29 | GA(N2) | — | 900(VC) | 11.7 | 476 | |
| 85 | 1.9 | 29 | 1.49 | GA(N2) | — | 850(VC) | 10.2 | 468 | |
| 86 | 1.9 | 22 | 1.26 | GA(N2) | — | 800(Ar) | 11.7 | 460 | |
| 87 | 1.9 | 30 | 1.29 | GA(N2) | — | 750(Ar) | 11.1 | 394 | |
| 88 | 1.9 | 27 | 1.52 | GA(N2) | — | 700(Ar) | 11.4 | 394 | |
| 89 | 1.9 | 27 | 1.29 | GA(N2) | — | 600(Ar) | 12.0 | 401 | |
| 90 | 1.9 | 21 | 1.51 | GA(N2) | — | 550(VC) | 10.9 | 371 | |
| 91 | 1.9 | 27 | 1.41 | GA(N2) | — | 500(Ar) | 11.2 | 479 | |
| 92 | 1.9 | 23 | 1.52 | GA(N2) | — | 450(Ar) | 10.9 | 452 | |
| 93 | 1.9 | 20 | 1.30 | GA(N2) | — | 400(Ar) | 10.3 | 410 | |
| 94 | 1.9 | 26 | 1.42 | GA(N2) | — | 300(N2) | 10.3 | 395 | |

TABLE 3-continued

| | | | | | | | | | |
|---|---|---|---|---|---|---|---|---|---|
| 95 | 0.9 | 189 | 1.17 | GA(N2) | 950(VC) | 700(Ar) | 11.3 | 484 | |
| 96 | 1.0 | 157 | 1.31 | GA(N2) | 800(VC) | 701(Ar) | 11.9 | 432 | |
| 97 | 1.0 | 111 | 1.17 | GA(N2) | 750(Ar) | 702(Ar) | 12.0 | 463 | |
| 98 | 0.9 | 134 | 1.31 | GA(N2) | 950(VC) | 600(Ar) | 12.8 | 359 | |
| 99 | 1.0 | 148 | 1.18 | GA(N2) | 800(VC) | 601(Ar) | 11.0 | 488 | |
| 100 | 1.0 | 152 | 1.37 | GA(N2) | 750(Ar) | 602(Ar) | 12.6 | 469 | |
| 101 | 1.0 | 23 | <u>0.92</u> | GA(N2) | — | — | 3.5 | 835 | Comparative |
| 102 | 1.0 | 22 | 1.48 | GA(N2) | — | — | 19.5 | <u>150</u> | Examples |
| 103 | 1.0 | 20 | <u>0.93</u> | WA | — | — | 8.0 | 578 | |
| 104 | 0.5 | <u>4</u> | 1.50 | WA | — | — | 2.2 | <u>154</u> | |
| 105 | 1.0 | 19 | <u>0.99</u> | CP | — | — | 9.2 | 578 | |
| 106 | 1.0 | <u>4</u> | 1.26 | CP | — | — | 3.0 | 449 | |
| 107 | 1.0 | 22 | <u>0.95</u> | GA(N2) | — | — | 4.0 | 873 | |
| 108 | 1.0 | 18 | 1.30 | GA(N2) | — | — | 17.6 | <u>100</u> | |
| 109 | 1.0 | 20 | <u>0.89</u> | GA(N2) | — | — | 10.5 | 456 | |
| 110 | 0.5 | <u>4</u> | 1.55 | GA(N2) | — | — | 2.1 | <u>181</u> | |
| 111 | 1.0 | 24 | <u>0.98</u> | DA | — | — | 7.8 | 628 | |
| 112 | 1.0 | <u>4</u> | 1.21 | DA | — | — | 3.5 | <u>186</u> | |
| 113 | 1.0 | 20 | <u>0.97</u> | WA | — | — | 18.0 | <u>50</u> | |
| 114 | 1.0 | 20 | <u>0.96</u> | GA(N2) | — | — | 12.5 | 433 | |
| 115 | 1.0 | 18 | <u>0.97</u> | DA | — | — | 10.6 | 531 | |
| 116 | 1.0 | 20 | <u>0.95</u> | GA(Ar) | — | — | 11.6 | 437 | |
| 117 | 1.0 | 189 | 1.42 | GA(Ar) | — | — | 12.5 | 416 | |
| 118 | <u>6.0</u> | <u>4</u> | 1.28 | GA(N2) | — | — | 3.2 | 436 | |
| 119 | 4.0 | <u>4</u> | 1.12 | WA | — | — | 3.2 | 537 | |
| 120 | 1.0 | 19 | <u>0.94</u> | WA | — | — | 3.2 | 634 | |
| 121 | <u>NP</u> | <u>NP</u> | <u>NP</u> | GA(N2) | 1250 | — | <u>NP</u> | <u>NP</u> | |
| 122 | 1.9 | 23 | 1.40 | GA(N2) | — | 1000 | 14.0 | <u>155</u> | |

Remark 1) WA: Water atomization, GA(Ar): Ar atomization, GA(N2): Nitrogen atomization, DA: Disk atomization, CP: Cast pulverization, VC: Vacuum, NP: Non-producible
Remark 2) Temp. (Atmosphere) in heat treatment
Remark 3) Underline indicates "outside of the present invention conditions and insufficient effects".

Comparative example 101, having a high C content, exhibits a low saturation magnetization and a low real permeability μ'. Comparative example 102, having a low C content, exhibits a low frequency (FR). Comparative example 103, having a high Cr content, exhibits a low saturation magnetization. Comparative example 104, having a low Cr content and a low average aspect ratio, exhibits a low real permeability μ' and a low frequency (FR). Comparative example 105, having a high N content, exhibits a low saturation magnetization. Comparative example 106, having a low N content and a low average aspect ratio, exhibits a low real permeability μ'.

Comparative example 107, having a high C content, exhibits a low saturation magnetization and a low real permeability μ'. Comparative example 108, having a low C content, exhibits a low frequency (FR). Comparative example 109, having a high Cr content, exhibits a low saturation magnetization. Comparative example 110, having a low Cr content, exhibits a low real permeability μ' and a low frequency (FR). Comparative example 111, having a high N content, exhibits a low saturation magnetization.

Comparative example 112, having a low N content and a low average aspect ratio, exhibits a low real permeability μ' and a low frequency (FR). Comparative example 113, having a high Si content and a low saturation magnetization, exhibits a low frequency (FR). Comparative example 114, having a high Mn content, exhibits a low saturation magnetization. Comparative example 115, having a high Mo content, exhibits a low saturation magnetization. Comparative example 116, having a high V content, exhibits a low saturation magnetization. Comparative example 117, having a large average diameter, exhibits noticeable irregularities on the surface of the sheet.

Comparative example 118, having a large average thickness and a low average aspect ratio, exhibits a low real permeability μ'. Comparative example 119, having a low average aspect ratio, exhibits a low real permeability μ'. Comparative example 120, having a low saturation magnetization, exhibits a low real permeability μ'. Comparative example 121, requiring a high temperature in a first heat treatment, cannot produce flaky powder. Comparative example 122, requiring a high temperature in a second heat treatment, exhibits a low frequency (FR). In contrast, all the flaky powder and magnetic sheets of inventive Examples 1 to 100 satisfy the requirements of the present invention, and exhibit longitudinal coercive forces exceeding 2400 A/m, which is the upper limit that can be measured with a coercive force meter. Accordingly, it is understood that each sample sufficiently achieves all the target effects.

As described above, a flaky powder and magnetic sheets including the powder for high frequency application are provided, wherein the flaky powder, containing a martensitic phase having a high C content and N, has a high coercive force and generates a soft retained austenitic phase before a flattening process due to a lowered Ms point caused by a high Cr content, and thereby achieve a high aspect ratio through the flattening process

The invention claimed is:
1. A flaky powder for high frequency application, comprising:
    1.5 to 3.0 mass % C, 10 to 20 mass % Cr, 0.03 to 0.30 mass % N, and the balance being Fe and incidental impurities, and having
    an average particle diameter of 200 μm or less, an average thickness of 5 μm or less, an average aspect ratio of 5 or more, a saturation magnetization of more than 1.0 T, and a frequency (FR) of 200 MHz or more at which tan δ reaches 0.1.
2. The flaky powder for high frequency application according to claim 1, further comprising:
    one or more of 1.0 mass % or less Si, 1.0 mass % or less Mn, 1.0 mass % or less Mo, and 7.5 mass % or less V.

3. A magnetic sheet containing the flaky powder according to claim 2.

4. A magnetic sheet containing the flaky powder according to claim 1.

\* \* \* \* \*